United States Patent
Hsieh et al.

(10) Patent No.: US 10,803,280 B2
(45) Date of Patent: Oct. 13, 2020

(54) FINGERPRINT IDENTIFICATION DEVICE AND MANUFACTURING METHOD THEREOF

(71) Applicant: Reco Technology (Chengdu) Co., Ltd., Sichuan (CN)

(72) Inventors: Pei-Chun Hsieh, Guangdong (CN); Hung-Chieh Lu, Guangdong (CN)

(73) Assignee: RECO TECHNOLOGY (CHENGDU) CO., LTD., Sichuan (CN)

( * ) Notice: Subject to any disclaimer, the term of this patent is extended or adjusted under 35 U.S.C. 154(b) by 14 days.

(21) Appl. No.: 16/166,144

(22) Filed: Oct. 21, 2018

(65) Prior Publication Data

US 2019/0384958 A1  Dec. 19, 2019

(30) Foreign Application Priority Data

Jun. 14, 2018 (CN) .......................... 2018 1 0613366

(51) Int. Cl.
| | |
|---|---|
| *G06K 9/00* | (2006.01) |
| *B06B 1/06* | (2006.01) |
| *G06K 9/20* | (2006.01) |
| *H01L 41/08* | (2006.01) |
| *H01L 41/193* | (2006.01) |
| *H01L 41/338* | (2013.01) |

(52) U.S. Cl.
CPC .......... *G06K 9/0002* (2013.01); *B06B 1/0622* (2013.01); *B06B 1/0677* (2013.01); *G06K 9/209* (2013.01); *H01L 41/0825* (2013.01); *H01L 41/193* (2013.01); *H01L 41/338* (2013.01)

(58) Field of Classification Search
CPC .. G06K 9/00; G06K 9/00006; G06K 9/00013; G06K 9/0002; H01L 41/00–47
See application file for complete search history.

(56) References Cited

U.S. PATENT DOCUMENTS

| | | | | |
|---|---|---|---|---|
| 2003/0146673 | A1* | 8/2003 | Toda | ........................ G06F 3/043 310/313 D |
| 2014/0354596 | A1* | 12/2014 | Djordjev | .............. G06K 9/0002 345/175 |
| 2015/0015515 | A1* | 1/2015 | Dickinson | ............... G06F 3/043 345/173 |
| 2017/0364726 | A1* | 12/2017 | Buchan | ................ G06K 9/0002 |

* cited by examiner

*Primary Examiner* — Koosha Sharifi-Tafreshi
(74) *Attorney, Agent, or Firm* — CKC & Partners Co., LLC

(57) ABSTRACT

A fingerprint identification device includes a substrate, a piezoelectric layer, a conductive layer, and a planar layer. The piezoelectric layer is disposed on the substrate. The conductive layer is disposed on the piezoelectric layer, and the conductive layer has a rugged microstructure on an upper surface of the conductive layer. The planar layer is disposed on the conductive layer, and a bottom of the planar layer fills the rugged microstructure of the conductive layer.

8 Claims, 8 Drawing Sheets

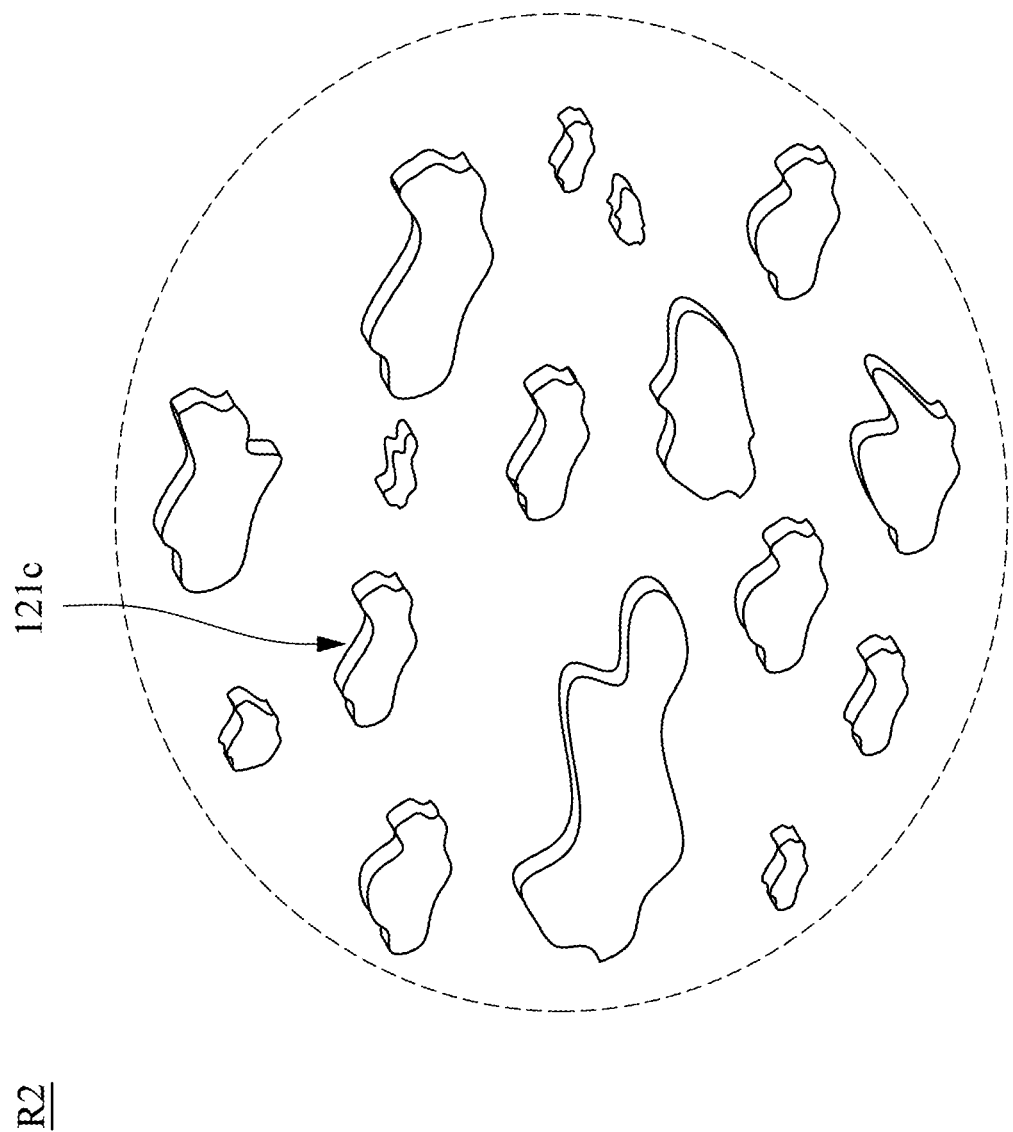

FINGERPRINT IDENTIFICATION DEVICE AND MANUFACTURING METHOD THEREOF

RELATED APPLICATIONS

This application claims priority to Chinese Application Serial Number 201810613366.4, filed Jun. 14, 2018, which is herein incorporated by reference.

BACKGROUND

Field of Invention

The present invention relates to a fingerprint identification device and a manufacturing method thereof.

Description of Related Art

Fingerprint identification devices are widely employed in various fields, such as industries, national defense, firefighting, electronics, etc. However, as limited by the material properties and manufacturing process of the conductive layer in fingerprint identification devices, the formed conductive layer has a rugged microstructure on the surface of the conductive layer. During the fingerprint identification, a small gap exists between the finger and the conductive layer because of the rugged microstructure, resulting in an increase in noise.

SUMMARY

One aspect of the present invention is to provide a fingerprint identification device. The fingerprint identification device includes a substrate, a piezoelectric layer, a conductive layer, and a planar layer. The piezoelectric layer is disposed on the substrate. The conductive layer is disposed on the piezoelectric layer, and the conductive layer has a rugged microstructure disposed on an upper surface of the conductive layer. The planar layer is disposed on the conductive layer, and a bottom of the planar layer fills into the rugged microstructure of the conductive layer.

In some embodiments of the present invention, the planar layer has an upper surface that is substantially planar.

In some embodiments of the present invention, the planar layer has a thickness of 5 µm to 200 µm.

In some embodiments of the present invention, a sidewall of the piezoelectric layer, a sidewall of the conductive layer, and a sidewall of the planar layer are coplanar with each other.

In some embodiments of the present invention, another sidewall of the piezoelectric layer, another sidewall of the conductive layer, and another sidewall of the planar layer are coplanar with each other.

In some embodiments of the present invention, an acute angle is formed between the sidewall of the piezoelectric layer and an upper surface of the substrate.

In some embodiments of the present invention, the acute angle ranges from 30° to 70°.

In some embodiments of the present invention, a distance between a sidewall of the piezoelectric layer and a sidewall of the substrate is 50 µm to 500 µm.

Another aspect of the present invention is to provide a manufacturing method of a fingerprint identification device. The manufacturing method includes steps of (i) providing a substrate; (ii) forming a piezoelectric material on the substrate; (iii) forming a conductive material on the piezoelectric material, in which the conductive material has a rugged microstructure on an upper surface thereof; (iv) forming a layer of planar material on the conductive material, in which a bottom of the material of planar layer fills into the rugged microstructure of the conductive material; and (v) dicing the material of planar layer, the conductive material, and the piezoelectric material to form a plurality of stack structures, in which each of the stack structures includes a piezoelectric layer, a conductive layer disposed on the piezoelectric layer, and a planar layer disposed on the conductive layer.

In some embodiments of the present invention, step (iv) includes substeps of (a) adhering a high acoustic impedance material on the conductive material; (b) thermal-pressing the high acoustic impedance material; and (c) baking the high acoustic impedance material, thereby forming the material of planar layer.

It is to be understood that both the foregoing general description and the following detailed description are by examples, and are intended to provide further explanation of the invention as claimed.

BRIEF DESCRIPTION OF THE DRAWINGS

FIG. 3B is a detailed view of a region in FIG. 3A.

DETAILED DESCRIPTION

The following disclosure provides many different embodiments, or examples, for implementing different features of the provided subject matter. These are, of course, merely examples and are not intended to be limiting. The embodiments disclosed below may be combined or substituted with each other in an advantageous situation, and other embodiments may be added to an embodiment without further description or explanation. In the following description, many specific details will be described in detail. The details are to enable the reader to fully understand the following embodiments. The embodiments of the present invention may be practiced without such specific details.

The embodiments of the present invention are described below, but these embodiments are in no way to be considered limiting the scope of the invention in any manner.

Figure 1:
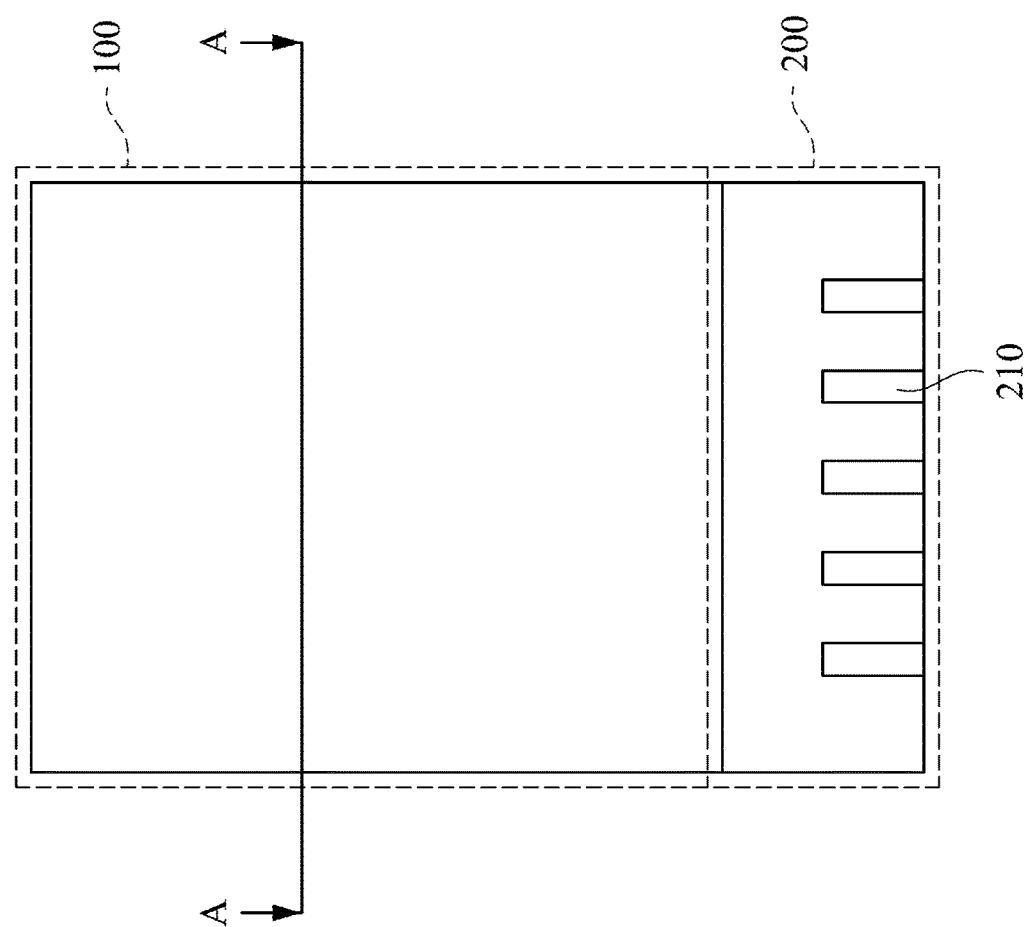
FIG. 1 is a schematic top view of a fingerprint identification module according to one embodiment of the present invention.

FIG. 1 depicts a schematic top view of a fingerprint identification module 10, according to one embodiment of the present invention. As shown in FIG. 1, the fingerprint identification module 10 includes a fingerprint identification device 100 and a connecting member 200. The fingerprint identification device 100 serves for identifying the fingerprint of whom touching an upper surface of the fingerprint identification device 100. The connecting member 200 is electrically connected to the fingerprint identification device 100. The connecting member 200 includes a plurality of connecting pads 210, and the fingerprint identification device 100 is electrically connected to an external circuit through the connecting pad 210 of the connecting member 200.

Figure 2A:
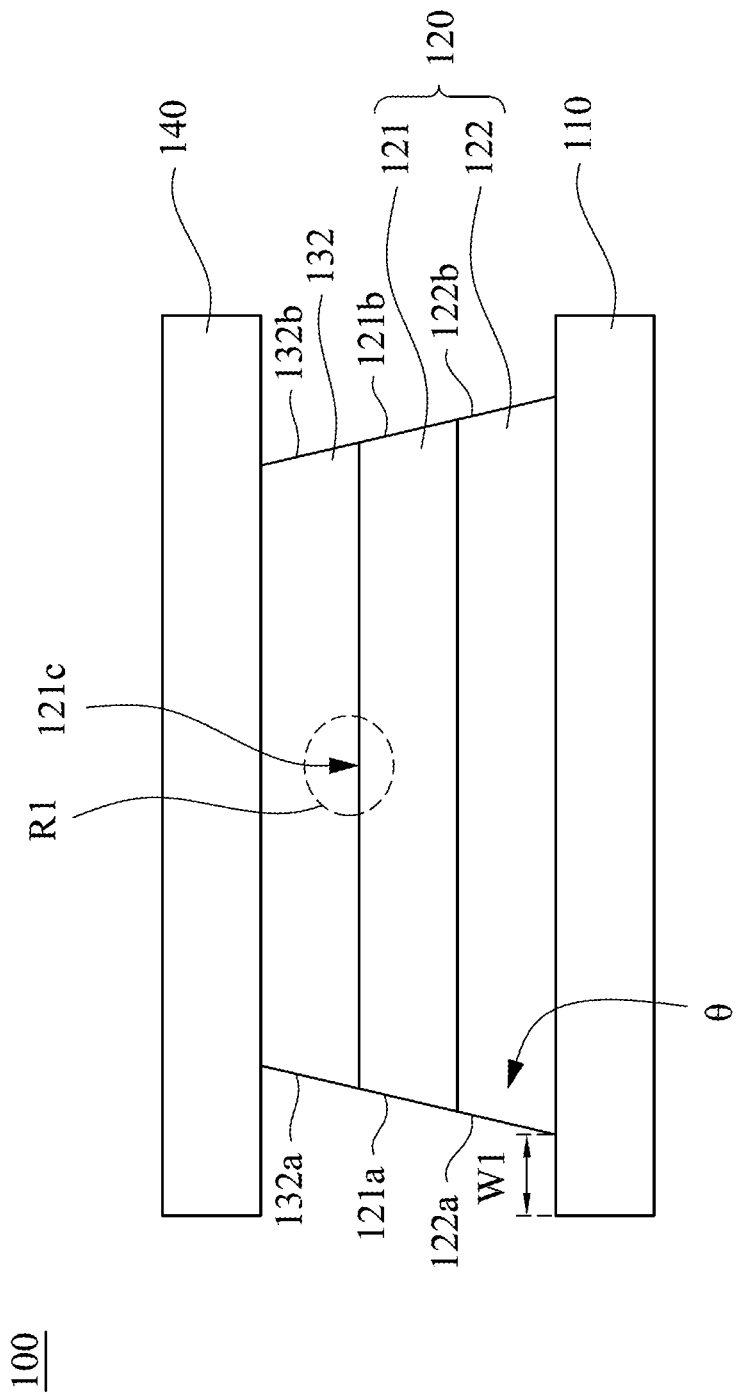
FIG. 2A is a schematic sectional view of the fingerprint identification device in FIG. 1 along line A-A, according to one embodiment of the present invention.
Figure 2B:
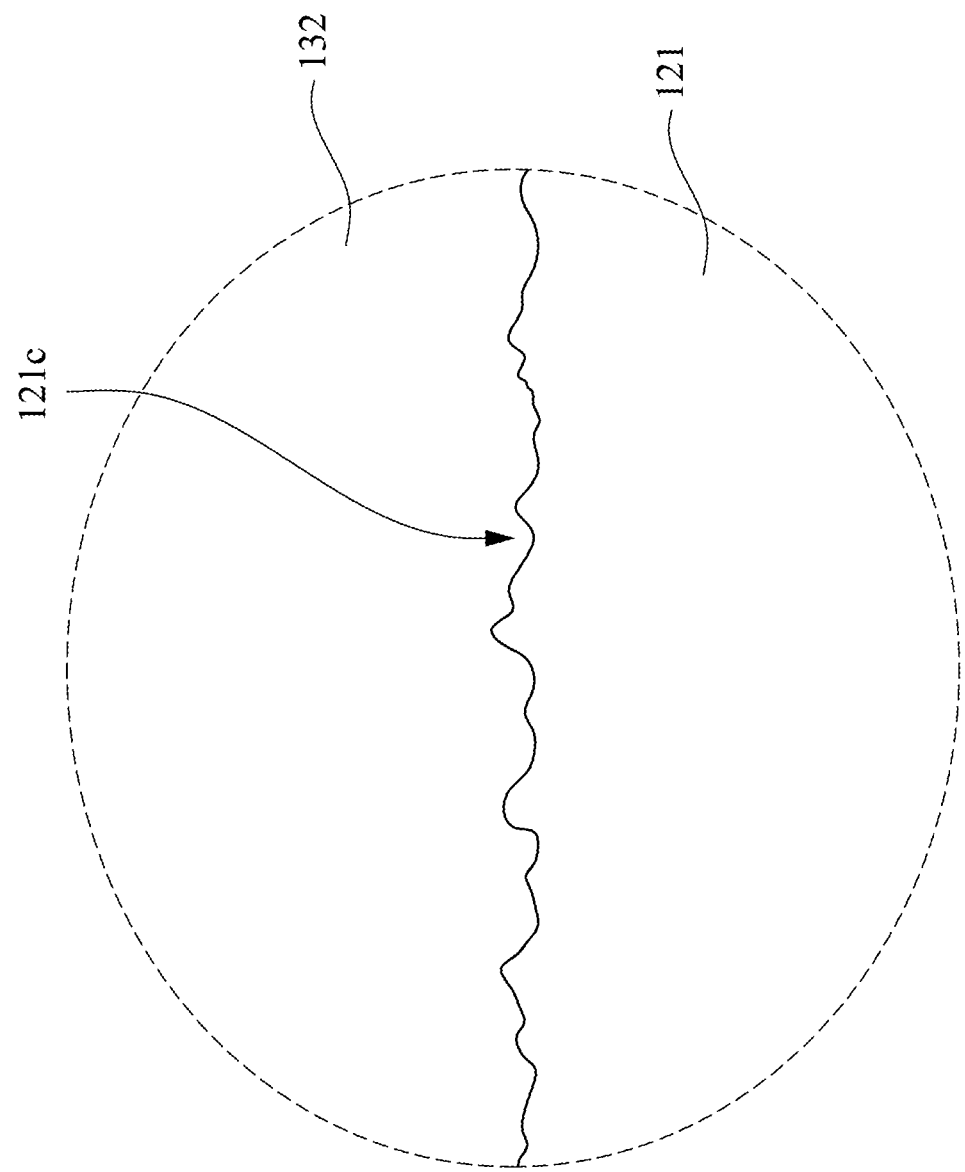
FIG. 2B is a detailed view of a region in FIG. 2A.

FIG. 2A depicts a schematic sectional view of the fingerprint identification device 100 in FIG. 1 along line A-A, according to one embodiment of the present invention. FIG. 2B depicts a detailed view of a region R1 in FIG. 2A. As shown in FIG. 2A, the fingerprint identification device 100 includes a substrate 110, an image sensor 120, and a planar layer 132. The image sensor 120 includes a piezoelectric layer 122 and a conductive layer 121. The piezoelectric layer 122 is disposed on the substrate 110.

In some examples, the substrate 110 includes a thin film transistor substrate having thin film transistors. In some examples, the substrate 110 has a thickness of 90 μm to 500 μm. In some examples, the piezoelectric layer 122 includes polyvinylidene fluoride (PVDF), or polyvinylidene fluoride-co-trifluoroethylene (PVDF-TrFE).

In some examples, the piezoelectric layer 122 has a thickness of 3 μm to 20 μm, such as 4 μm, 5 μm, 8 μm, 11 μm, 15 μm, or 18 μm. The conductive layer 121 is disposed on the piezoelectric layer 122.

In some examples, the conductive layer 121 includes metal, such as silver, copper, or nickel. In some examples, the conductive layer 121 has a thickness of 5 μm to 30 μm, such as 6 μm, 8 μm, 11 μm, 15 μm, 20 μm, 25 μm, or 28 μm.

The planar layer 132 is disposed on the conductive layer 121. In some examples, the planar layer 132 includes a high acoustic impedance material, such as epoxy resin, acrylic resin, polymethyl methacrylate, polyimine, or polycarbonate. In some examples, the planar layer 132 is opaque.

In some examples, the fingerprint identification device 100 further includes an ultrasonic generator (not shown). When the fingerprint identification device 100 is in operation, the ultrasonic generator produces an ultrasonic wave with a frequency greater than 20,000 Hz. The generated ultrasonic wave is reflected from the finger that touches the upper surface of the fingerprint identification device 100, and then transmits to the piezoelectric layer 122. The piezoelectric layer 122 receives the reflected ultrasonic wave and converts the ultrasonic wave into an electrical signal. The conductive layer 121 serves for transmitting the electrical signal to the substrate 110 having the thin film transistors. In this way, the thin film transistors receive the electrical signal and convert the electrical signal into a grayscale image of the fingerprint, and thereby identifying the fingerprint.

In other examples, the fingerprint identification device 100 further includes a power supply component (not shown), and the power supply component supplies electrical energy to the piezoelectric layer 122. When the piezoelectric layer 122 receives the electrical energy, deformation occurs in the piezoelectric layer 122 due to the properties of the piezoelectric material. Therefore, if an alternating current with a specific frequency is supplied, the piezoelectric layer 122 may vibrate and emit an ultrasonic wave with a frequency greater than 20,000 Hz. In this way, the piezoelectric layer 122 is electrified and vibrates, thereby generating ultrasonic waves. Thereafter, the electrical power supplied to the piezoelectric layer 122 is interrupted, and then the piezoelectric layer 122 is switched to a detection mode. In this mode, the piezoelectric layer 122 receives the reflected ultrasonic wave and converts the ultrasonic wave into electrical signals.

However, as described above, as limited by the material properties and manufacturing process of the conductive layer 121, the conductive layer 121 has a rugged microstructure 121c on an upper surface of the conductive layer 121 (as shown in FIG. 2B). In the fingerprint identification device 100 as disclosed herein, a bottom of the planar layer 132 fills into the rugged microstructure 121c of the conductive layer 121. In addition, the upper surface of the planar layer 132 is substantially planar. In this way, the rugged microstructure 121c of the conductive layer 121 does not impact the fingerprint identification, resulting in a noise reduction.

On the other hand, the planar layer 132 disposed on the conductive layer 121 may block out outside air and prevent any physical collision, thereby preventing the conductive layer 121 from being scratched and oxidized. In some examples, the planar layer 132 has a thickness of 5-200 μm, such as 6 μm, 8 μm, 11 μm, 50 μm, 100 μm, 150 μm, 188 μm, 192 μm, or 195 μm. When the thickness of the planar layer 132 is less than 5 μm, the filling in the rugged microstructure 121c of the conductive layer 121 is poor. When the thickness of the planar layer 132 is greater than 200 μm, the signal intensity may be reduced.

As shown in FIG. 2A, in some examples, a first sidewall 122a of the piezoelectric layer 122, a first sidewall 121a of the conductive layer 121, and a first sidewall 132a of the planar layer 132 are coplanar with each other. In some examples, a second sidewall 122b of the piezoelectric layer 122, a second sidewall 121b of the conductive layer 121, and a second sidewall 132b of the planar layer 132 are coplanar with each other.

An acute angle Θ is formed between the first sidewall 122a of the piezoelectric layer 122 and the upper surface of the substrate 110. The acute angle Θ is 30°-70°, such as 35°, 40°, 45°, 50°, 55°, 60°, or 65°. Similarly, another acute angle having the same angular range is formed between the second sidewall 122b of the piezoelectric layer 122 and the upper surface of the substrate 110. The first sidewall 122a, the first sidewall 121a, and the first sidewall 132a are coplanar with each other, while the second sidewall 122b, the second sidewall 121b, and the second sidewall 132b are coplanar with each other.

In one example, the dicing angle can be tuned to avoid the material of planar layer, the conductive material, or the piezoelectric material from cracking during the dicing. When there is an acute angle of 30°-70° between the dicing direction and the upper surface of the substrate 110, the dicing performance is optimal. Therefore, there is an acute angle Θ of 30°-70° between the first sidewall 122a of the formed piezoelectric layer 122 and the upper surface of the substrate 110.

In some examples, a distance W1 between the first sidewall 122a of the piezoelectric layer 122 and a sidewall of the substrate 110 is 50 μm to 500 μm, such as 70 μm, 90 μm, 120 μm, 150 μm, 200 μm, 300 μm, 400 μm, 450 μm, or 480 μm.

In some examples, the fingerprint identification device 100 further includes a cover 140. The cover 140 is disposed on the planar layer 132. In one example, the cover 140 includes a glass cover. In one example, the cover 140 has a thickness of 400 μm to −800 μm.

Figure 3A:
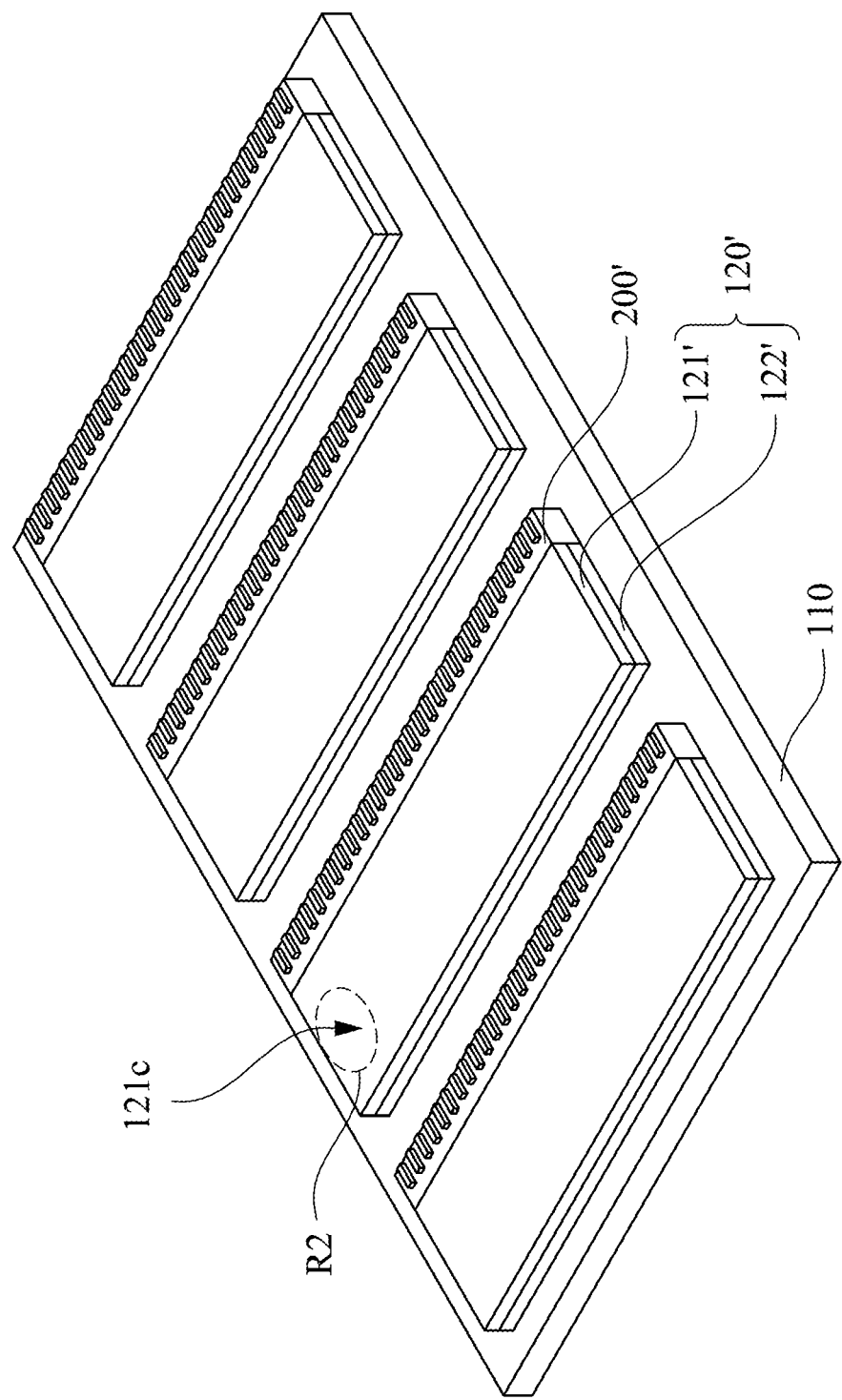
FIG. 3A and FIG. 4 are schematic three-dimensional views of a fingerprint identification device during various stages of a manufacturing method thereof, according to one embodiment of the present invention.
Figure 4:
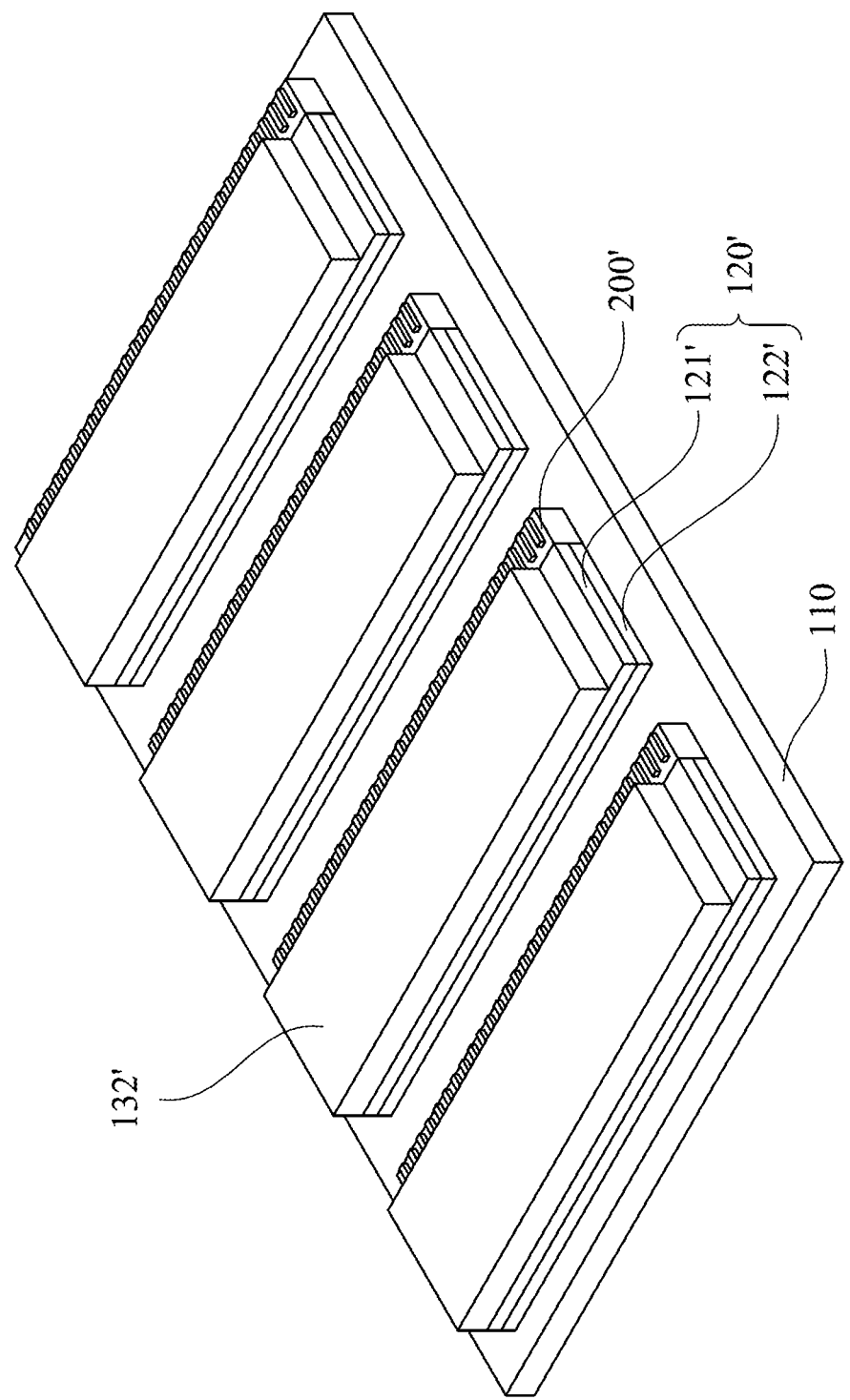

The present invention also provides a manufacturing method of the fingerprint identification device 100. FIG. 3A and FIG. 4 are schematic three-dimensional views of a fingerprint identification device 100 during various stages of a manufacturing method thereof, according to one embodiment of the present invention. FIG. 3B depicts a detailed view of a region R2 in FIG. 3A.

As shown in FIG. 3A, an image-sensing structural layer 120' and a connecting member structural layer 200' is formed on a substrate 110. Specifically, the formation of the image-sensing structural layer 120' includes forming a piezoelectric material 122' on the substrate 110 and forming a conductive material 121' on the piezoelectric material 122'. As shown in FIG. 3B, the conductive material 121' has a rugged microstructure 121c on an upper surface of the conductive material 121'. In some examples, a plurality of image-sensing structural layers 120' as formed may be arranged in one direction, such as the four image-sensing structural layers 120' depicted in FIG. 3A.

As shown in FIG. 4, a layer of planar material 132' is formed on the image-sensing structural layer 120'. A bottom of the layer of planar material 132' fills into the rugged microstructure 121c of the conductive material 121'. The formation of the layer of planar material 132' includes adhering a high acoustic impedance material on the conductive material 121', followed by thermal-pressing the high acoustic impedance material, and then baking the high acoustic impedance material, thereby forming the layer of planar material 132'.

Figure 5A:
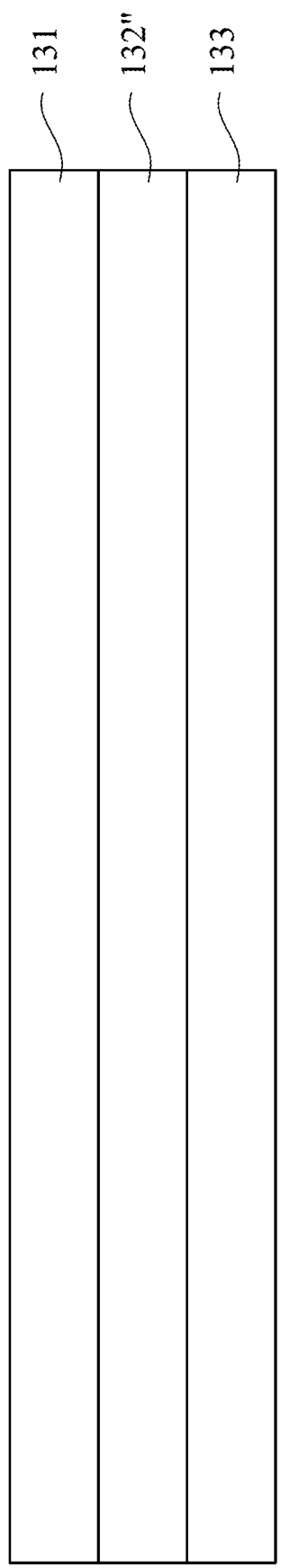
FIG. 5A and FIG. 5B are schematic sectional views of a high acoustic impedance material adhesive film according to one embodiment of the present invention.

FIG. 5A is a schematic sectional view of a high-acoustic-impedance-material adhesive film according to one embodiment of the present invention. As shown in FIG. 5A, the high-acoustic-impedance-material adhesive film includes a first release film 131, a second release film 133, and a high-acoustic-impedance-material 132" interposed between the first release film 131 and the second release film 133. The first release film 131 may be stripped off to expose the high-acoustic-impedance-material 132". Next, the exposed high-acoustic-impedance-material 132" may be adhered on the image-sensing structural layer 120'. The high-acoustic-impedance-material adhesive film of the present invention may have a different form other than the sheet-like morphology as shown in FIG. 5A.

Figure 5B:
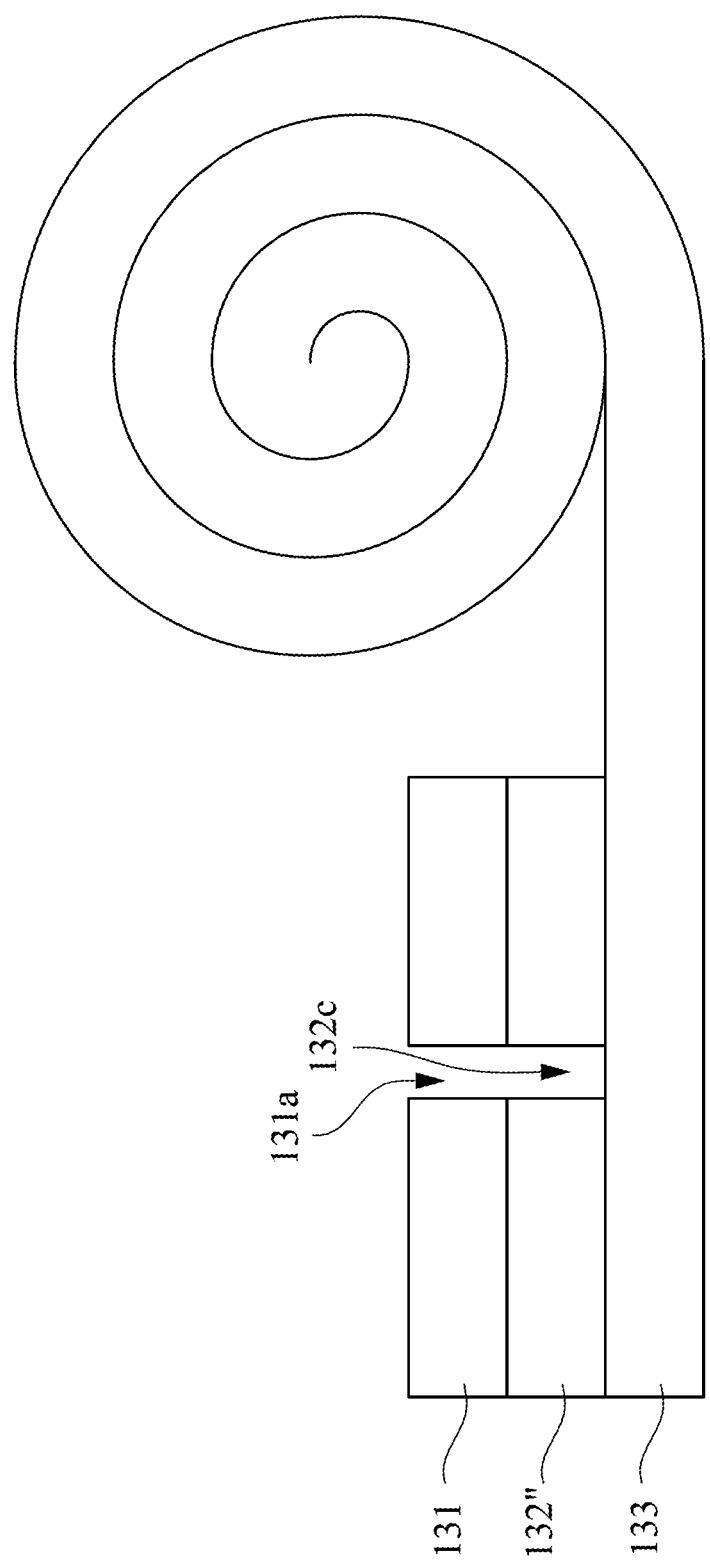

FIG. 5B is a schematic sectional view of a high-acoustic-impedance-material adhesive film according to another embodiment of the present invention. In FIG. 5B, the high-acoustic-impedance-material adhesive film is in a rolled-up shape, and each part of the first release film 131 of the high-acoustic-impedance-material adhesive film is separated from one another by a first gap 131a. Meanwhile each part of high-acoustic-impedance-material 132" is separated from one another by a second gap 132c, which is connected to the first gap 131a. The high-acoustic-impedance-material adhesive film can be cut into a suitable size, and similarly, the first release film 131 may be stripped off to expose the high-acoustic-impedance-material 132", such that the high-acoustic-impedance-material 132" may be adhered on the image-sensing structural layer 120'.

In some examples, the baking temperature of the high-acoustic-impedance-material 132" is 60° C. to 130° C., such as 70° C., 80° C., 90° C., 100° C., 110° C., or 120° C. When the baking temperature is greater than 130° C., the underlying the conductive material 121' may flake off from the piezoelectric material 122'. When the baking temperature is lower than 60° C., the layer of planar material 132' as formed may have an insufficient adhesion strength. In some examples, the baking time of the high-acoustic-impedance-material 132" ranges from 20 minutes to 150 minutes. After the baking, the second release film 133 is stripped off to expose the material 132' of planar layer (as shown in FIG. 4).

Next, a dicing process is performed. In the dicing process, the layer of planar material 132', the conductive material 121', and the piezoelectric material 122' are diced, thereby forming a plurality of stack structures. Each of the stack structures includes a piezoelectric layer 122, a conductive layer 121, and a planar layer 132. Subsequently, a cover 140 is adhered on the stack structures so to form the fingerprint identification device 100 shown in FIG. 2A. As described above, by tuning the dicing angle, the cracking of the layer of planar material 132', the conductive material 121', or the piezoelectric material 122' during dicing can be avoided. Therefore, during the dicing process, there is an acute angle of 30°~70° between the dicing direction and the upper surface of the substrate 110.

As disclosed in the abovementioned examples, the fingerprint identification device as disclosed herein includes a planar layer disposed on the conductive layer. The planar layer may reduce noise and prevent the conductive layer from being scratched and oxidized.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A fingerprint identification device, comprising:
    a substrate;
    a piezoelectric layer disposed on the substrate;
    a conductive layer disposed on the piezoelectric layer; and
    a planar layer disposed on the conductive layer and directly adhering the conductive layer;
    wherein a distance between a sidewall of the piezoelectric layer and a sidewall of the substrate is 50 µm to 500 µm.

2. The fingerprint identification device of claim 1, wherein the planar layer has an upper surface which is substantially planar.

3. The fingerprint identification device of claim 1, wherein the planar layer has a thickness of 5 µm to 200 µm.

4. The fingerprint identification device of claim 1, wherein the sidewall of the piezoelectric layer, a sidewall of the conductive layer, and a sidewall of the planar layer are coplanar with each other.

5. The fingerprint identification device of claim 4, wherein another sidewall of the piezoelectric layer, another sidewall of the conductive layer, and another sidewall of the planar layer are coplanar with each other.

6. The fingerprint identification device of claim 4, wherein an acute angle is formed between the sidewall of the piezoelectric layer and an upper surface of the substrate.

7. The fingerprint identification device of claim 6, wherein the acute angle ranges from 30° to 70°.

8. A manufacturing method of fingerprint identification device, comprising steps of:
    providing a substrate;
    forming a piezoelectric material on the substrate;
    forming a conductive material on the piezoelectric material;
    forming a layer of planar material on the conductive material and directly adhering the conductive layer, comprising:
        adhering a high acoustic impedance material on the conductive material;
        thermal-pressing the high acoustic impedance material; and baking the high acoustic impedance material, thereby forming the layer of the planar material; and dicing the layer of the planar material, the conductive material, and the piezoelectric material to form a plurality of stack structures, wherein each of the stack structures comprises a piezoelectric layer, a conductive layer disposed on the piezoelectric layer, and a planar layer disposed on the conductive layer.

\* \* \* \* \*